United States Patent
Yamashita et al.

(10) Patent No.: US 11,728,165 B2
(45) Date of Patent: Aug. 15, 2023

(54) METHOD OF PROCESSING SUBSTRATE, SUBSTRATE PROCESSING APPARATUS, RECORDING MEDIUM, AND METHOD OF MANUFACTURING SEMICONDUCTOR DEVICE

(71) Applicant: KOKUSAI ELECTRIC CORPORATION, Tokyo (JP)

(72) Inventors: Hiroki Yamashita, Toyama (JP); Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 218 days.

(21) Appl. No.: 17/191,328

(22) Filed: Mar. 3, 2021

(65) Prior Publication Data

US 2021/0280409 A1 Sep. 9, 2021

(30) Foreign Application Priority Data

Mar. 4, 2020 (JP) .................. 2020-036388

(51) Int. Cl.
*H01L 21/02* (2006.01)
*H01L 21/265* (2006.01)

(52) U.S. Cl.
CPC .... *H01L 21/0228* (2013.01); *H01L 21/02126* (2013.01); *H01L 21/02211* (2013.01); *H01L 21/26593* (2013.01)

(58) Field of Classification Search
None
See application file for complete search history.

(56) References Cited

U.S. PATENT DOCUMENTS

| | | |
|---|---|---|
| 2011/0312148 A1 | 12/2011 | Kim et al. |
| 2013/0149873 A1 | 6/2013 | Hirose et al. |
| 2013/0252435 A1 | 9/2013 | Shimamoto et al. |
| 2015/0243498 A1 | 8/2015 | Hirose et al. |
| 2016/0365243 A1 | 12/2016 | Hirose et al. |
| 2018/0301333 A1 | 10/2018 | Li et al. |

FOREIGN PATENT DOCUMENTS

| | | |
|---|---|---|
| JP | 2013-140944 A | 7/2013 |
| JP | 2013-225657 A | 10/2013 |
| TW | 201201278 A | 1/2012 |
| TW | 201326452 A | 7/2013 |

OTHER PUBLICATIONS

Taiwan Office Action dated Apr. 6, 2022 for Taiwan Patent Application No. 110101757.
Japanese Office Action dated Feb. 15, 2022 for Japanese Patent Application No. 2020-036388.
Korean Office Action dated Oct. 12, 2022 for Korean Patent Application No. 10-2021-0028141.

*Primary Examiner* — Asok K Sarkar
(74) *Attorney, Agent, or Firm* — Volpe Koenig

(57) ABSTRACT

There is included (a) forming a first film containing at least oxygen and carbon and having a concentration of carbon, which is 20 at % or more, on a substrate by supplying a film-forming gas to the substrate at a first temperature; and (b) modifying the first film into a second film by supplying an oxygen- and hydrogen-containing gas to the substrate on which the first film is formed, at a second temperature that is equal to or higher than the first temperature.

20 Claims, 6 Drawing Sheets

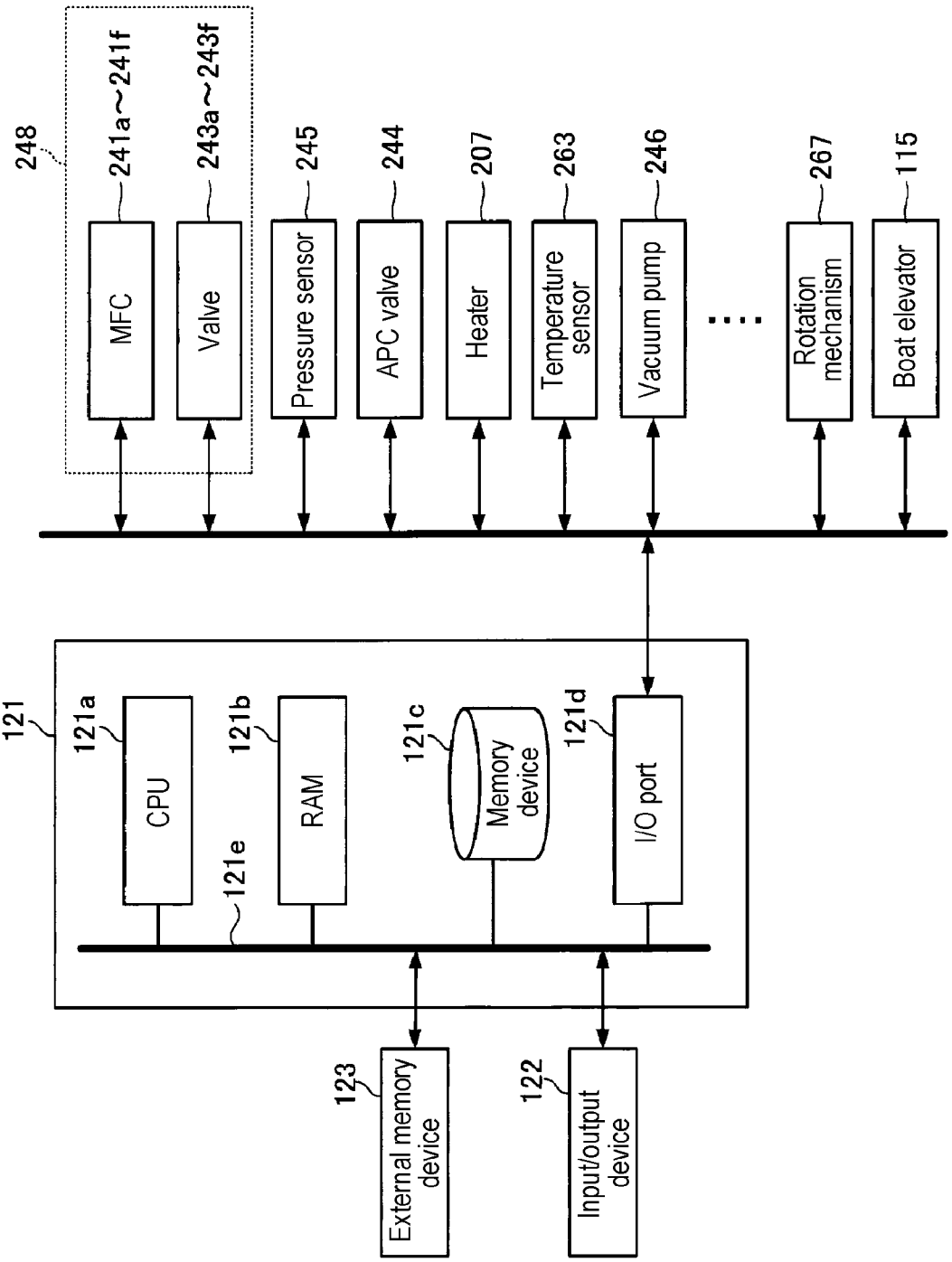

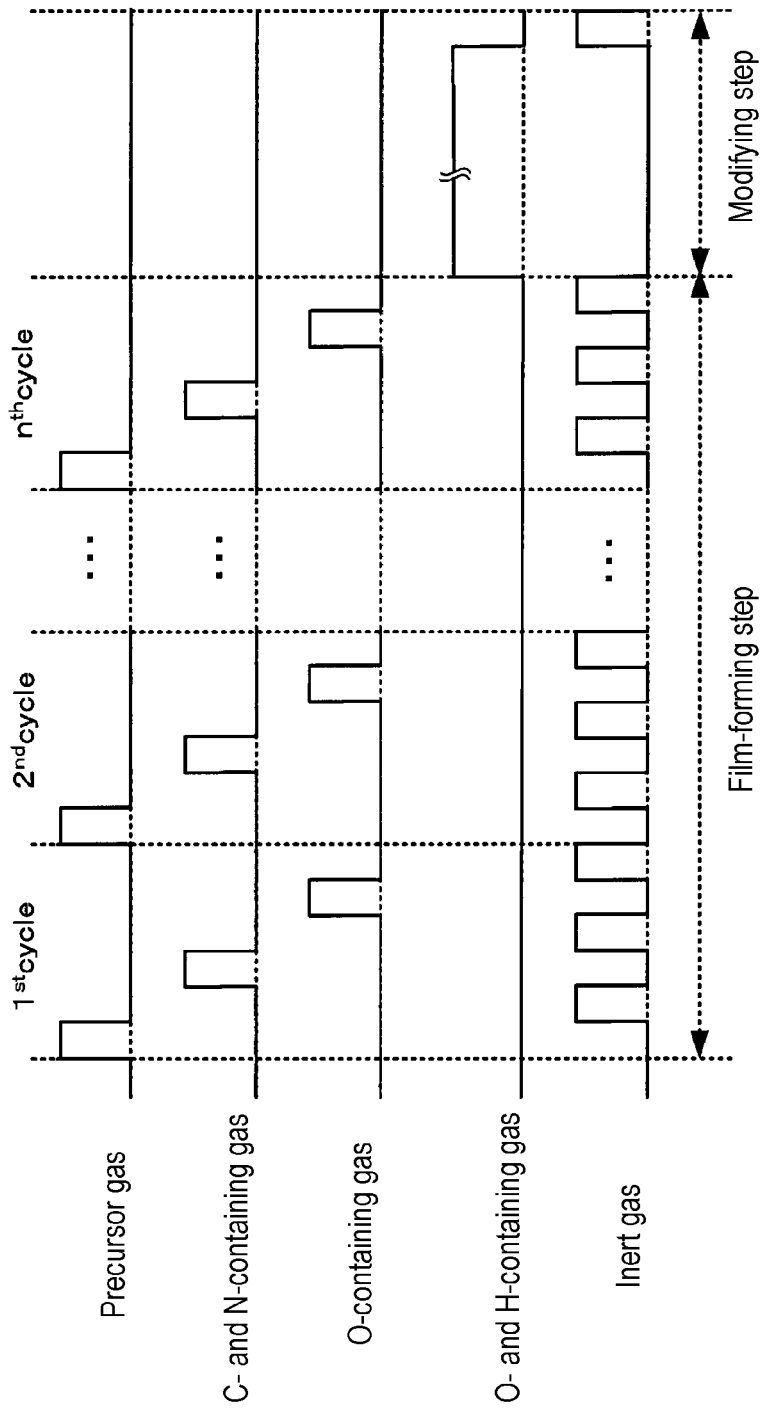

Concave portion

200

SiOC(N) layer

200

First film (SiOC(N) film)

Seam or void

200

Second film (SiOC(N) film)

200

Expansion coefficient before and after modifying process

Change in film thickness before and after annealing process

METHOD OF PROCESSING SUBSTRATE, SUBSTRATE PROCESSING APPARATUS, RECORDING MEDIUM, AND METHOD OF MANUFACTURING SEMICONDUCTOR DEVICE

CROSS-REFERENCE TO RELATED APPLICATION

This application is based upon and claims the benefit of priority from Japanese Patent Application No. 2020-036388, filed on Mar. 4, 2020, the entire contents of which are incorporated herein by reference.

TECHNICAL FIELD

The present disclosure relates to a method of manufacturing a semiconductor device, a substrate processing apparatus, and a recording medium.

BACKGROUND

As one process of manufacturing a semiconductor device, there may be a case that performs a process of forming a film such as a silicon oxycarbonitride film (SiOCN film) or a silicon oxycarbide film (SiOC film) on a substrate. In such a case, the film may be formed on a substrate having a concave portion such as a trench or a hole formed in the surface of the substrate, and thus, a seam or a void may be generated in the film formed in the concave portion according to an aspect ratio of the concave portion.

SUMMARY

Some embodiments of the present disclosure provide a technique capable of forming a void-free and seamless film on a substrate.

According to one or more embodiments of the present disclosure, there is provided a technique that includes:

(a) forming a first film containing at least oxygen and carbon and having a concentration of carbon, which is 20 at % or more, on a substrate by supplying a film-forming gas to the substrate at a first temperature; and (b) modifying the first film into a second film by supplying an oxygen- and hydrogen-containing gas to the substrate on which the first film is formed, at a second temperature that is equal to or higher than the first temperature.

BRIEF DESCRIPTION OF DRAWINGS

FIG. 3 is a schematic configuration diagram of a controller of the substrate processing apparatus suitably used in an embodiment of the present disclosure, in which a control system of the controller is illustrated in a block diagram.

FIG. 4 is a flow diagram showing a substrate processing sequence according to an embodiment of the present disclosure.

DETAILED DESCRIPTION

Figure 1:
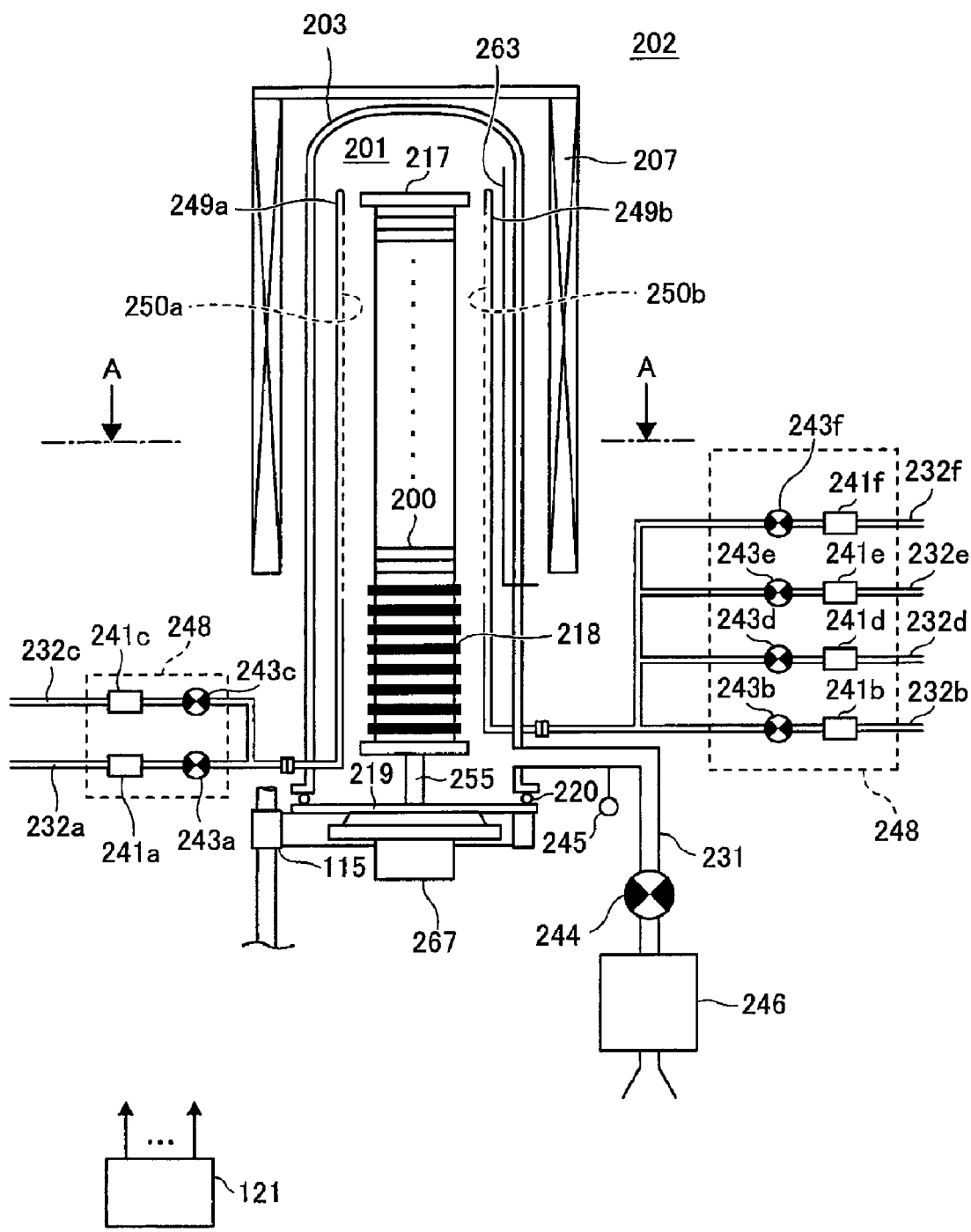
FIG. 1 is a schematic configuration view of a vertical process furnace of a substrate processing apparatus suitably used in an embodiment of the present disclosure, in which a portion of the process furnace is illustrated in a vertical cross-sectional view.

In a CVD (Chemical Vapor Deposition) method, which is generally known as a film-forming method, a deposition rate is not isotropic with respect to a three-dimensional substrate surface. When a film is formed on a non-planar substrate surface, for example, a substrate surface on which a trench-shaped pattern, a hole-shaped pattern, or both of them are formed, it may be difficult for the existing CVD method to control the film thickness inside a concave portion such as a trench or a hole. In particular, in the concave portion, the film thickness at the bottom may be thinner than the film thickness at the top, thereby generating a difference in the film thickness (deteriorating step coverage). This is because it is difficult for the CVD method to uniformly supply vapor phase-reacted molecules to various parts in the concave portion. Further, it has been known that the difference in the film thickness between the bottom and the top becomes larger (the step coverage is deteriorated) as the aspect ratio of the concave portion becomes larger. Furthermore, when the film formation at the top of the concave portion proceeds at a faster rate than that at the bottom and an opening of the concave portion is blocked, the supply of the vapor phase-reacted molecules or a precursor gas to the inside of the concave portion may be obstructed after the blocking, resulting in a seam or a void.

On the other hand, it may be considered to use an ALD (Atomic Layer Deposition) method, which can obtain an isotropic deposition rate with respect to the three-dimensional substrate surface. However, the above-mentioned problem of blocking g the upper portion of the concave portion may still occur for film formation on a pattern including a concave portion such as a trench or a hole with a reverse taper shape. As a result, a seam or a void, which extends in a depth direction (for example, a vertical direction) of the concave portion, may be generated in the central portion of a film formed in the concave portion.

When the seam or the void is generated in the film formed in the concave portion, there may be a case that, in a wet etching process after the film formation, a chemical solution may permeate the inside of the concave portion through the seam or the void generated in the film, which may have an adverse effect on a base.

With respect to the above-mentioned problems, the present disclosers and the like have discovered that, by performing a step of forming a first film containing at least oxygen and carbon and having a concentration of carbon, which is 20 at % or more, on a substrate by supplying a film-forming gas to the substrate at a first temperature; and a step of modifying the first film into a second film by supplying an oxygen- and hydrogen-containing gas to the substrate on which the first film is formed, at a second temperature that is equal to or higher than the first temperature, when a seam or a void is generated in the first film, the seam or the void can be eliminated by film increase (film expansion) occurring during the modifying step. The present disclosure is based on the above findings discovered by the present disclosers and the like.

One Embodiment of the Present Disclosure

One embodiment of the present disclosure will now be described with reference to FIGS. 1 to 5D.
(1) Configuration of Substrate Processing Apparatus As shown in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate through a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed at the gas supply pipes 232a and 232b, respectively, sequentially from the upstream side of gas flow. A gas supply pipe 232c is connected to the gas supply pipe 232a at the downstream side of the valve 243a. Gas supply pipes 232d, 232e, and 232f are connected to the gas supply pipes 232b at the downstream side of the valve 243b. MFCs 241c, 241d, 241e, and 241f and valves 243c, 243d, 243e, and 243f are installed to the gas supply pipes 232c, 232d, 232e, and 232f, sequentially from the upstream side of the gas flow.

Figure 2:
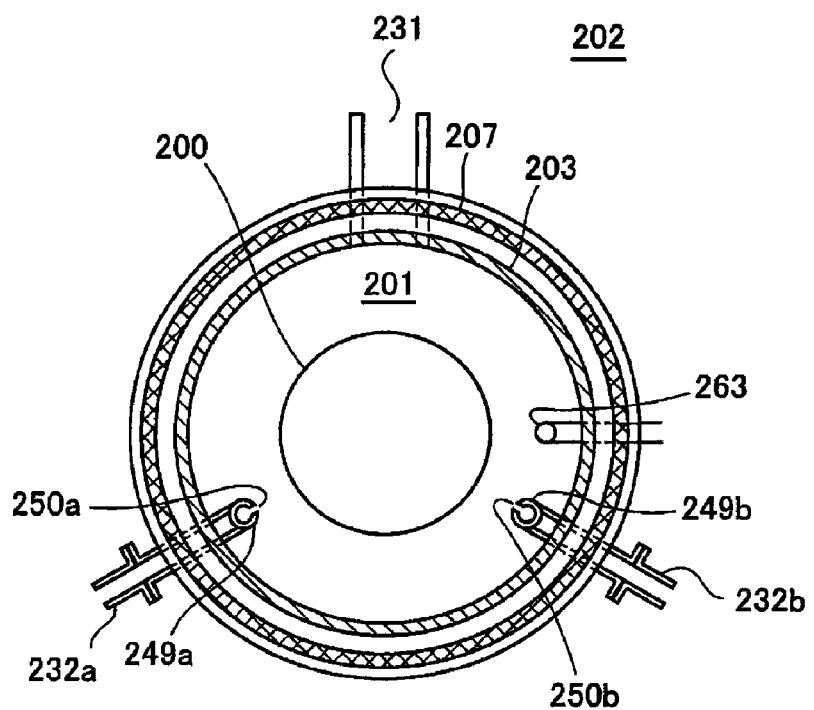
FIG. 2 is a schematic configuration view of the vertical process furnace of the substrate processing apparatus suitably used in an embodiment of the present disclosure, in which a portion of the process furnace is illustrated in a cross-sectional view taken along line A-A in FIG. 1.

As shown in FIG. 2, each of the nozzles 249a and 249b is installed at a space, which has an annular shape in a plane view, between an inner wall of the reaction tube 203 and the wafers 200 so as to extend upward along an arrangement direction of the wafers 200 from a lower portion of the inner wall of the reaction tube 203 to an upper portion of the inner wall of the reaction tube 203. Specifically, each of the nozzles 249a and 249b is installed at a lateral side of the wafer arrangement region at which the wafers 200 are arranged, namely at a region horizontally surrounding a wafer arrangement region, so as to extend along the wafer arrangement region. Gas supply holes 250a and 250b for supplying a gas are formed on side surfaces of the nozzles 249a and 249b, respectively. Each of the gas supply holes 250a and 250b is opened toward the center of the reaction tube 203 to allow the gas to be supplied toward the wafers 200. Gas supply holes 250a and 250b may be installed in a plural number between a lower portion of the reaction tube 203 and an upper portion of the reaction tube 203.

As a precursor gas (film-forming gas), for example, a halosilane-based gas, which is one of Si-containing gases containing silicon (Si) as a main element (predetermined element) constituting a film, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state at room temperature and atmospheric pressure, or a precursor which remains in a gas state at room temperature and atmospheric pressure. Halosilane refers to silane having a halogen element. The halogen element may be chlorine (Cl), fluorine (F), bromine (Br), iodine (I), or the like. As the halosilane-based gas, for example, a precursor gas containing Si and Cl, that is, a chlorosilane-based gas, can be used. The chlorosilane-based gas acts as a Si source.

As a reaction gas (film-forming gas), a carbon (C)- and nitrogen (N)-containing gas, which is one of carbon (C)-containing gases and is also one of nitrogen (N)-containing gases, is supplied from the gas supply pipe 232b into the process chamber 201 via the MFC 241b, the valve 243b, and the nozzle 249b. As the C- and N-containing gas, for example, an amine-based gas can be used. The amine-based gas acts as a C source and an N source.

An inert gas is supplied from the gas supply pipes 232c and 232d into the process chamber 201 via the MFCs 241c and 241d, the valves 243c and 243d, the gas supply pipes 232a and 232b, and the nozzles 249a and 249b, respectively. The inert gas acts as a purge gas, a carrier gas, a dilution gas, or the like.

As a reaction gas (film-forming gas), for example, an oxygen (O)-containing gas is supplied from the gas supply pipe 232e into the process chamber 201 via the MFC 241e, the valve 243e, the gas supply pipe 232b, and the nozzle 249b. The O-containing gas acts as an oxidizing agent (oxidizing gas), that is, as an O source. As the O-containing gas, for example, an H-free and O-containing gas can be used. The H-free and O-containing gas can also be referred to as a first oxidizing agent (first oxidizing gas). In the present disclosure, for the sake of convenience, the H-free and O-containing gas may be also simply referred to as an O-containing gas.

As a modifying gas, for example, an oxygen (O)- and hydrogen (H)-containing gas, which is one of O-containing gases, is supplied from the gas supply pipe 232f into the process chamber 201 via the MFC 241f, the valve 243f, the gas supply pipe 232b, and the nozzle 249b. The O- and H-containing gas acts as an oxidizing agent (oxidizing gas), that is, as an O source. The O- and H-containing gas may be also referred to as a second oxidizing agent (second oxidizing gas).

A Si-containing gas supply system mainly includes the gas supply pipe 232a, the MFC 241a, and the valve 243a. A C- and N-containing gas supply system mainly includes the gas supply pipe 232b, the MFC 241b, and the valve 243b. An O-containing gas supply system mainly includes the gas supply pipe 232e, the MFC 241e, and the valve 243e. An O- and H-containing gas supply system mainly includes the gas supply pipe 232f, the MFC 241f, and the valve 243f. An inert gas supply system mainly includes the gas supply pipes 232c and 232d, the MFCs 241c and 241d, and the valves 243c and 243d. The Si-containing gas supply system may also be referred to as a precursor gas supply system, and the C- and N-containing gas supply system and the O-containing gas supply system may also be referred to as a reaction gas supply system. The precursor gas supply system and the reaction gas supply system may also be referred to as a film-forming gas supply system. The O-containing gas supply system and the O- and H-containing gas supply systems may also be referred to as a first oxidizing agent (first oxidizing gas) supply system and a second oxidizing agent (second oxidizing gas) supply system, respectively.

One or all of the above-described various supply systems may be configured as an integrated-type supply system 248 in which the valves 243a to 243f, the MFCs 241a to 241fi and so on are integrated. The integrated-type supply system 248 is connected to each of the gas supply pipes 232a to 232f. In addition, the integrated-type supply system 248 may be configured such that operations of supplying various gases into the gas supply pipes 232a to 232f (that is, opening/closing operation of the valves 243a to 243f, flow rate adjustment operation by the MFCs 241a to 241f, and the like) are controlled by a controller 121 which will be described later. The integrated-type supply system 248 is configured as an integral type or division type integrated unit, and may be attachable/detachable to/from the gas supply pipes 232a to 232f, and the like on an integrated unit basis, so that the maintenance, replacement, extension, or the like of the integrated-type supply system 248 can be performed on an integrated unit basis.

An exhaust pipe 231 for exhausting an internal atmosphere of the process chamber 201 is installed below a sidewall of the reaction tube 203. A vacuum pump 246, as a vacuum-exhausting device, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure adjustment part). The APC valve 244 is configured to perform or stop a vacuum-exhausting operation in the process chamber 201 by opening or closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the pressure sensor 245, and the APC valve 244. The exhaust system may include the vacuum pump 246.

A seal cap 219, which serves as a furnace opening cover configured to hermetically seal a lower end opening of the reaction tube 203, is installed under the reaction tube 203. The seal cap 219 is made of, for example, a metal material such as stainless steel (SUS), and is formed in a disc shape. An O-ring 220, which is a seal member making contact with the lower end of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevation mechanism installed outside the reaction tube 203. The boat elevator 115 is configured as a transfer device (transfer mechanism) which loads/unloads (transfers) the wafers 200 into/out of the process chamber 201 by moving the seal cap 219 up and down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat insulating plates 218 made of, for example, a heat resistant material such as quartz or SiC, are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus and a process recipe, in which sequences and conditions of substrate processing to be described later are written, are readably stored in the memory device 121c. The process recipe functions as a program for causing the controller 121 to execute each sequence in a substrate processing process, which will be described later, to obtain a predetermined result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. In addition, the RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the heater 207, the temperature sensor 263, the vacuum pump 246, the rotation mechanism 267, the boat elevator 115, and the like.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjustment operation of various kinds of gases by the MFCs 241a to 241f, the opening/closing operation of the valves 243a to 243f, the opening/closing operation of the APC valve 244, the pressure adjusting operation performed by the APC valve 244 based on the pressure sensor 245, the driving and stopping of the vacuum pump 246, the temperature adjustment operation performed by the heater 207 based on the temperature sensor 263, the operation of rotating the boat 217 and adjusting the rotation speed of the boat 217 by the rotation mechanism 267, the operation of moving the boat 217 up and down by the boat elevator 115, and the like, according to contents of the read recipe.

The controller 121 may be configured by installing, on the computer, the aforementioned program stored in an external memory device 123. The external memory device 123 includes, for example, a magnetic disk such as an HDD, an optical disc such as a CD, a magneto-optical disc such as an MO, a semiconductor memory such as a USB memory, and the like. The memory device 121c and the external memory device 123 are configured as a non-transitory computer-readable recording medium. Hereinafter, the memory device 121c and the external memory device 123 may be generally and simply referred to as a "recording medium." When the term "recording medium" is used herein, it may indicate a case of including the memory device 121c only, a case of including the external memory device 123 only, or a case of including both the memory device 121c and the external memory device 123. Furthermore, the program may be provided to the computer using communication means such as the Internet or a dedicated line, instead of using the external memory device 123.

(2) Substrate Processing Process

As one process for manufacturing a semiconductor device using the aforementioned substrate processing apparatus, a sequence example of forming a first film containing at least 0 and C and having a concentration of C, which is 20 at % or more, on a wafer 200 as a substrate in which a concave portion such as a trench or a hole is formed on the surface of the wafer 200, by supplying a film-forming gas (precursor gas or reaction gas) to the wafer 200 at a first temperature; and modifying the first film into a second film by supplying an O- and H-containing gas on the wafer 200 on which the first film is formed, at a second temperature that is equal to or higher than the first temperature, will be described mainly with reference to FIGS. 4 and 5A to 5D. In the following descriptions, the operations of the respective parts constituting the substrate processing apparatus are controlled by the controller 121.

The substrate processing sequence shown in FIG. 4 includes:

a film-forming step (FIGS. 5A to 5C) of forming a SiOC(N) film as a first film containing at least 0 and C and having a concentration of C, which is 20 at % or more, on a wafer 200 in which a concave portion is formed on the surface of the wafer 200, so as to fill an inside of the concave portion by performing a cycle a predetermined number of times, the cycle including non-simultaneously performing: a step 1 of supplying a precursor gas to the wafer 200 at a first temperature; a step 2 of supplying a C- and N-containing gas as a reaction gas to the wafer 200 at the first temperature; and a step 3 of supplying an O-containing gas as a reaction gas to the wafer 200; and a modifying step (FIG. 5D) of modifying the first film into a second film by supplying an O- and H-containing gas to the wafer 200 on which the first film is formed, at a second temperature that is equal to or higher than the first temperature.

In the present disclosure, a SiOC layer or a SiOCN layer is also referred to as a SiOC(N) layer, and a SiOC film or a SiOCN film is also referred to as a SiOC(N) film.

In the present disclosure, for the sake of convenience, the substrate processing sequence shown in FIG. 4 may be denoted as follows. The same denotation may be used in the following modifications to be described later.

(Precursor gas C→and N-containing gas→O-containing gas)×n→O- and H-containing gas When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

A plurality of wafers 200 are charged on the boat 217 (wafer charging). Then, as shown in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.

(Pressure Adjustment and Temperature Adjustment)

The interior of the process chamber 201, namely, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information (pressure adjustment). The wafers 200 in the process chamber 201 are heated by the heater 207 to a desired processing temperature. In this operation, the state of supplying electric power to the heater 207 is feedback-controlled based on the temperature information detected by the temperature sensor 263 such that the interior of the process chamber 201 has a desired temperature distribution (temperature adjustment). The rotation of the wafers 200 by the rotation mechanism 267 is then initiated. Actuating the vacuum pump 246 and heating and rotating the wafers 200 may be continuously performed at least until processing of the wafers 200 is completed.

(Film-Forming Step)

The following steps 1 to 3 are then performed in a sequential manner.

[Step 1]

Figure 5A:
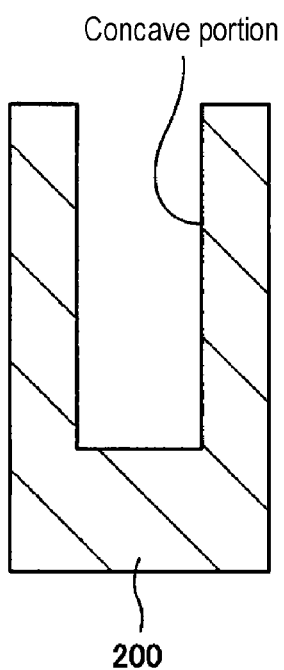
FIG. 5A is a partially enlarged view of a cross section of a wafer before a film-forming process.

In this step, a precursor gas is supplied to a wafer 200 that is accommodated in the process chamber 201 and has a concave portion formed in the surface as shown in FIG. 5A. Specifically, the valve 243a is opened to allow the precursor gas to flow into the gas supply pipe 232a. The flow rate of the precursor gas is adjusted by the MFC 241a, and the precursor gas is supplied into the process chamber 201 through the nozzle 249a and is exhausted through the exhaust pipe 231. In this operation, the precursor gas is supplied to the wafer 200. At this time, the valves 243c and 243d are opened to allow an inert gas to flow into the gas supply pipes 232c and 232d.

An example of a process condition of this step is described as follows.

Processing temperature (first temperature): 400 to 700 degrees C., specifically 600 to 650 degrees C.

Processing pressure: 1 to 2,666 Pa, specifically 67 to 1,333 Pa

Precursor gas supply flow rate: 0.01 to 2 slm, specifically 0.1 to 1 slm

Inert gas supply flow rate (for each gas supply pipe): 0 to 10 slm

Gas supply time: 1 to 120 seconds, specifically 1 to 60 seconds

In the present disclosure, the notation of a numerical range such as "1 to 2,666 Pa" means that the lower limit and the upper limit are included in the range. Therefore, "1 to 2,666 Pa" means "equal to or more than 1 Pa and equal to or less than 2,666 Pa." The same applies to other numerical ranges.

By supplying the precursor gas to the wafer 200 under the above-mentioned condition, when the precursor gas is a chlorosilane-based gas, a Si-containing layer containing Cl is formed on the outermost surface of the wafer 200. The Si-containing layer containing Cl is formed by physical adsorption or chemical adsorption of the precursor gas, chemical adsorption of a substance (hereinafter, $Si_xCl_y$) that is partially decomposed from the precursor gas, Si deposition caused by thermal decomposition of the precursor gas, and the like, on the outermost surface of the wafer 200. The Si-containing layer containing Cl may be an adsorption layer (physical adsorption layer or chemical adsorption layer) of the precursor gas or $Si_xCl_y$, or may be a Si deposition layer containing Cl. In the present disclosure, the Si-containing layer containing Cl is also simply referred to as a Si-containing layer.

After the Si-containing layer is formed on the wafer 200, the valve 243a is closed to stop the supply of the precursor gas into the process chamber 201. Then, the interior of the process chamber 201 is vacuum-exhausted to remove a gas or the like, which remains in the process chamber 201, from the interior of the process chamber 201. At this time, the valves 243c and 243d are opened to allow an inert gas to flow into the process chamber 201. The inert gas acts as a purge gas.

As the precursor gas (Si-containing gas), it may be possible to use, for example, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like, a fluorosilane-based gas such as a tetrafluorosilane ($SiF_4$) gas or the like, a bromosilane-based gas such as a tetrabromosilane ($SiBr_4$) gas or the like, or an iodosilane-based gas such as a tetraiodosilane ($SiI_4$) gas or the like.

As the inert gas, it may be possible to use, for example, a nitrogen ($N_2$) gas or various rare gases such as an Ar gas, a He gas, a Ne gas, a Xe gas, and the like. This also applies to step 2, step 3, and modifying step, which will be described below.

[Step 2]

After the step 1 is completed, a C- and N-containing gas is supplied to the wafer 200 in the process chamber 201, that is, to the Si-containing layer formed on the wafer 200 (C- and N-containing gas supply). Specifically, the opening/closing control of the valves 243b, 243c, and 243d is performed in the same procedure as the opening/closing control of the valves 243a, 243c, and 243d in the step 1. The C- and N-containing gas flows into the gas supply pipe 232b, the flow rate of the C- and N-containing gas is adjusted by the MFC 241b, and the C- and N-containing gas is supplied into the process chamber 201 via the nozzle 249b and is exhausted from the exhaust pipe 231. In this operation, the C- and N-containing gas is supplied to the wafer 200.

An example of a process condition in this step is described as follows.

Processing temperature (first temperature): 400 to 700 degrees C., specifically 600 to 650 degrees C.

Processing pressure: 133 to 5,333 Pa, specifically 133 to 4,000 Pa

C- and N-containing gas supply flow rate: 0.1 to 10 slm, specifically 0.5 to 5 slm Gas supply time: 1 to 120 seconds, specifically 1 to 60 seconds The other process condition is the same as the process condition in the step 1.

By supplying the C- and N-containing gas to the wafer 200 under the above-mentioned condition, the Si-containing layer can be modified by causing the Si-containing layer formed on the wafer 200 to react with the C- and N-containing gas and introducing N and C contained in the C- and N-containing gas into the Si-containing layer. As a result, as a layer containing Si, C, and N and not containing O, a silicon carbonitride layer (SiCN layer) is formed on the wafer 200. Further, in this step, by using a C- and N-containing gas such as an amine-based gas, as a reaction gas, an amount of C added to the SiCN layer can be increased, so that, for example, it is possible to make the amount of C added to the SiCN layer larger than an amount of N added to the SiCN layer. As a result, it is possible to make the concentration of C in the SiCN layer higher than the concentration of N in this layer. For example, the concentration of C in the SiCN layer can be set to 20 at % or more and 50 at % or less.

When the SiCN layer is formed, impurities such as Cl contained in the Si-containing layer constitute a gaseous substance containing at least Cl in the process of modification reaction of the Si-containing layer with the C- and N-containing gas and are discharged from the process chamber 201. As a result, the SiCN layer becomes a layer having fewer impurities such as Cl than the Si-containing layer formed in the step 1.

After the SiCN layer is formed, the valve 243b is closed to stop the supply of the C- and N-containing gas into the process chamber 201. Then, a gas or the like remaining in the process chamber 201 is removed from the process chamber 201 according to the same processing procedure as in the purge in the step 1 (purge).

As the reaction gas (C- and N-containing gas), it may be possible to use, for example, an ethylamine-based gas such as a monoethylamine (($C_2H_5$)$NH_2$, abbreviation: MEA) gas, a diethylamine (($C_2H_5$)$_2$NH, abbreviation: DEA) gas, a triethylamine (($C_2H_5$)$_3$N, abbreviation: TEA) gas or the like, or a methylamine-based gas such as a monomethylamine (($CH_3$)$NH_2$, abbreviation: MMA) gas, a dimethylamine (($CH_3$)$_2$NH, abbreviation: DMA) gas, a trimethylamine (($CH_3$)$_3$N, abbreviation: TMA) gas or the like. Further, as the C- and N-containing gas, in addition to the amine-based gas, it may be possible to use, for example, an organic hydrazine-based gas such as a monomethylhydrazine (($CH_3$)$HN_2H_2$, abbreviation: MMH) gas, a dimethylhydrazine (($CH_3$)$_2N_2H_2$, abbreviation: DMH) gas, a trimethylhydrazine (($CH_3$)$_2N_2(CH_3$)H, abbreviation: TMH) gas or the like.

[Step 3]

After the step 2 is completed, an O-containing gas is supplied to the wafer 200 in the process chamber 201, that is, the SiCN layer formed on the wafer 200 (O-containing gas supply). Specifically, the opening/closing control of the valves 243e, 243c, and 243d is performed in the same procedure as the opening/closing control of the valves 243a, 243c, and 243d in the step 1. The O-containing gas flows into the gas supply pipe 232e, the flow rate of the O-containing gas is adjusted by the MFC 241e, and then the O-containing gas is supplied into the process chamber 201 via the gas supply pipe 232b and the nozzle 249b and is exhausted from the exhaust pipe 231. In this operation, the O-containing gas is supplied to the wafer 200.

An example of a process condition in this step is described as follows

Processing temperature (first temperature): 400 to 700 degrees C., specifically 600 to 650 degrees C.

Processing pressure: 1 to 4,000 Pa, specifically 1 to 3,000 Pa

O-containing gas supply flow rate: 0.1 to 10 slm, specifically 0.5 to 5 slm

Gas supply time: 1 to 120 seconds, specifically 1 to 60 seconds

The other process condition is the same as the process condition in the step 1.

Figure 5B:
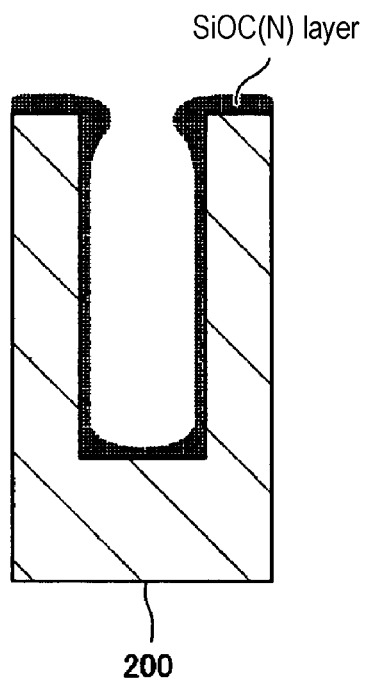
FIG. 5B is a partially enlarged view of a cross section of the wafer while the film-forming process is performed so as to fill an inside of a concave portion formed in the surface of the wafer.

By supplying the O-containing gas to the wafer 200 under the above-mentioned condition, at least a portion of the SiCN layer formed on the wafer 200 is oxidized (modified). As a result, as shown in FIG. 5B, as a layer containing Si, O, and C, a silicon oxycarbide layer (SiOC layer), which is a layer containing Si, O, and C, or a silicon oxycarbonitride layer (SiOCN layer), which is a layer containing Si, O, C, and N, is formed on the wafer 200. As described above, in the present disclosure, the SiOC layer or the SiOCN layer is also referred to as a SiOC(N) layer, and a SiOC film or a SiOCN film is also referred to as a SiOC(N) film. When the SiCN layer is formed, impurities such as Cl contained in the SiCN layer constitute a gaseous substance containing at least Cl in the process of modification reaction of the SiCN layer with the O-containing gas and are discharged from the process chamber 201. As a result, the SiOC(N) layer becomes a layer having fewer impurities such as Cl than the Si-containing layer formed in the step 1 or the SiCN layer formed in the step 2.

After the SiOC(N) layer is formed, the valve 243e is closed to stop the supply of the O-containing gas into the process chamber 201. Then, a gas or the like remaining in the process chamber 201 is removed from the process chamber 201 according to the same processing procedure as in the purge in the step 1 (purge).

As the reaction gas (O-containing gas), it may be possible to use, for example, an oxygen ($O_2$) gas, an ozone ($O_3$) gas, water vapor ($H_2O$ gas), a nitric oxide (NO) gas, a nitrous oxide ($N_2O$) gas, or the like.

(Performing Predetermined Number of Times)

Figure 5C:
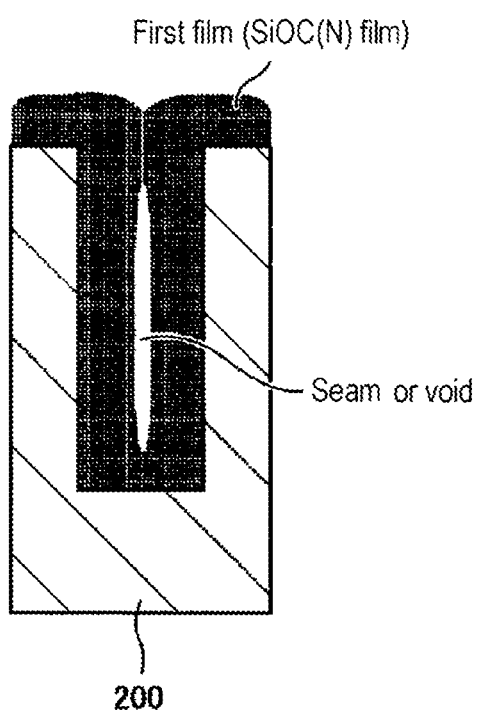
FIG. 5C is a partially enlarged view of a cross section of the wafer after the film-forming process is performed so as to fill an inside of the concave portion formed in the surface of the wafer.

By performing a cycle a predetermined number of times (n times, where n is an integer of 1 or more), the cycle including non-simultaneously, that is, non-synchronously, performing the above-described steps 1 to 3, a SiOC(N) film having a predetermined composition and a predetermined film thickness is formed as a first film on the wafer 200. As shown in FIG. 5C, the SiOC(N) film as the first film is formed so as to fill an interior of the concave portion formed on the surface of the wafer 200, which becomes a SiOC(N) film having a seam or a void. According to the present embodiment, the concentration of C in the SiOC(N) film as the first film can be set to, for example, 20 at % or more and 50 at % or less.

It is desirable that the above-mentioned cycle is repeated multiple times. That is, a thickness of the SiOC(N) layer formed per cycle may be set to be smaller than a desired film thickness, and the above-mentioned cycle may be repeated multiple times until the film thickness of a SiOC(N) film formed by laminating SiOC(N) layers becomes the desired film thickness.

If the concentration of C in the SiOC(N) film as the first film is less than 20 at %, the expansion coefficient (film increase rate) of the film due to a modifying process in a modifying step to be described later may be decreased. In this case, the seam or the void contained in the first film may not be sufficiently eliminated by the modifying process. By setting the concentration of C in the SiOC(N) film as the first film to 20 at % or more, the expansion coefficient (film increase rate) of the film due to the modifying process in the modifying step can be increased, which makes it possible to sufficiently eliminate the seam or the void contained in the first film by the modifying process.

Further, when the concentration of C in the SiOC(N) film as the first film exceeds 50 at %, a leakage current occurs in the SiOC(N) film as the second film obtained after the modifying process in the modifying step, which may result in deterioration of the electrical characteristics. By setting the concentration of C in the SiOC(N) film as the first film to 50 at % or less, this problem can be resolved, so that it is possible to prevent a leakage current in the SiOC(N) film as the second film obtained after the modifying process and deterioration of the electrical characteristics of the SiOC(N) film. Further, by setting the concentration of C in the SiOC(N) film as the first film to 40 at % or less, this problem can be more sufficiently resolved, so that it is possible to more sufficiently prevent the leakage current in the SiOC(N) film as the second film obtained after the modifying process and the deterioration of the electrical characteristics of the SiOC(N) film.

In view of these points, it is desirable that the concentration of C in the SiOC(N) film as the first film is 20 at % or more and 50 at % or less, specifically 20 at % or more and 40 at % or less.

(Purge Step)

After the film-forming step is completed, an inert gas is supplied from each of the gas supply pipes 232c and 232d into the process chamber 201 and is exhausted from the exhaust pipe 231. As a result, the interior of the process chamber 201 is purged and a gas, reaction by-products, and the like remaining in the process chamber 201 are removed from the process chamber 201. When the gas, reaction by-products, and the like remaining in the process chamber 201 are sufficiently removed from the process chamber 201 by the purge performed in the step 3 in the final cycle of the film-forming step, the purge step after the film-forming step is completed can be omitted. FIG. 4 shows an example in which the purge step after the film-forming step is completed is omitted.

(Modifying Step)

After the film-forming step is completed and the purge in the process chamber 201 is completed, in a state where the film-forming processed wafer 200 is accommodated in the process chamber 201, an O- and H-containing gas having a molecular structure, which is different from a molecular structure of the O-containing gas in the above-described step 3, is supplied to the wafer 200 in the process chamber 201, that is, to the SiOC(N) film as the first film formed on the wafer 200. Specifically, the opening/closing control of the valves 243f, 243c, and 243d is performed in the same procedure as the opening/closing control of the valves 243a, 243c, and 243d in the step 1. The O- and H-containing gas flows into the gas supply pipe 232f, the flow rate of the O- and H-containing gas is adjusted by the MFC 241f, and then the O- and H-containing gas is supplied into the process chamber 201 via the gas supply pipe 232b and the nozzle 249b and is exhausted from the exhaust pipe 231. In this operation, the O- and H-containing gas is supplied to the wafer 200.

An example of a process condition in this step is described as follow.

Processing temperature (second temperature): 400 to 900 degrees C., specifically 650 to 800 degrees C.

Processing pressure: 39,997 to 101,325 Pa, specifically 53,329 to 101, 325 Pa

O- and H-containing gas supply flow rate: 0.1 to 5 slm, specifically 0.3 to 2 slm Gas supply time: 60 to 300 minutes, specifically 120 to 180 minutes The other process condition is the same as the process condition in the step 1.

Further, it is desirable that the second temperature is set to be equal to or higher than the first temperature, specifically higher than the first temperature. That is, it is desirable that the processing temperature (modifying temperature) in the modifying step is equal to or higher than the processing temperature (film-forming temperature) in the film-forming step, specifically higher than the processing temperature (film-forming temperature) in the film-forming step.

By performing the modifying process on the first film under the above-mentioned condition, the first film can be oxidized and O can also be introduced into the first film. At this time, a portion of Cl, C, etc. contained in the first film is desorbed by the action of oxidation by the O- and H-containing gas. That is, by the modifying process, the concentration of O in the film is increased and the concentration of C in the film is decreased. In this way, by oxidizing the first film by the O- and H-containing gas, the first film can be modified into a second film having a composition different from a composition of the first film. Further, since both the first film and the second film are SiOC(N) films, the components of the films before and after the modifying process can be the same. However, the concentration of O in the second film becomes higher than the concentration of O in the first film and the concentration of C in the second film becomes lower than the concentration of C in the first film, and thus, the compositions of the first film and the second film become different from each other.

Figure 5D:
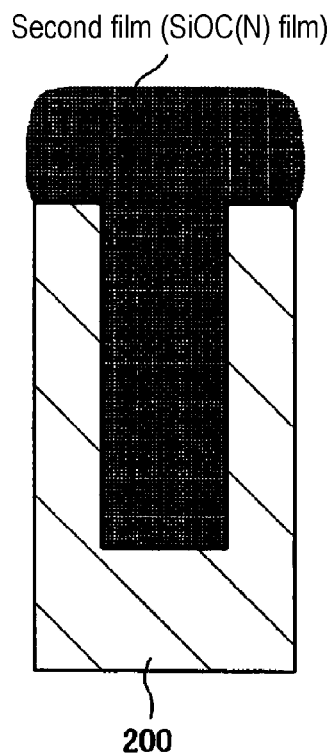
FIG. 5D is a partially enlarged view of a cross section of the wafer after a modifying process is performed after the film-forming process.

Then, by modifying the first film into the second film in this way, as shown in FIG. 5D, the thickness of the second film obtained by the modifying process becomes increased (expanded) to be thicker than the thickness of the first film before the modifying process, so that it is possible to eliminate the seam or the void contained in the first film.

As the O- and H-containing gas, in addition to water vapor ($H_2O$ gas), it may be possible to use, for example, a gas having an OH group such as a hydrogen peroxide ($H_2O_2$) gas, that is, a gas having an O—H bond.

(After-Purge and Atmospheric Pressure Return)

After the modifying process is completed, an inert gas is supplied into the process chamber 201 from each of the gas supply pipes 232c and 232d and is exhausted from the exhaust pipe 231. Thus, the interior of the process chamber 201 is purged and a gas, reaction by-products, and the like remaining in the process chamber 201 are removed from the process chamber 201 (after-purge). After that, the internal atmosphere of the process chamber 201 is substituted with an inert gas (inert gas substitution) and the internal pressure of the process chamber 201 is returned to an atmospheric pressure (atmospheric pressure return).

(Boat Unloading and Wafer Discharging)

After that, the seal cap 219 is moved down by the boat elevator 115 to open the lower end of the reaction tube 203. In addition, the processed wafers 200 supported by the boat 217 are unloaded from the lower end of the reaction tube 203 to the outside of the reaction tube 203 (boat unloading). The processed wafers 200 are unloaded out of the reaction tube 203 and are then discharged from the boat 217 (wafer discharging).

(3) Effects According to the Present Embodiment

According to the present embodiment, one or more effects set forth below may be achieved.

(a) Since the first film (SiOC(N) film) having the concentration of C, which is 20 at % or more, is formed on the wafer 200 at the first temperature in the film-forming step and is modified into the second film using the O- and H-containing gas at the second temperature in the modifying step, the film can expand when the first film is modified into the second film, so that, for example, even if a seam or a void is generated in the first film, the seam or the void can be eliminated. As a result, it is possible to improve the filling characteristics of the film formed in the concave portion. That is, void-free and seamless filling is possible.

In a case where the first film formed in the film-forming step is a film containing C but not containing O, such as a SiCN film, the film expansion coefficient thereof due to the modifying process is low, so that when a seam or a void is generated in the first film, it was confirmed that the seam or the void could not be eliminated. For this reason, the first film formed in the film-forming step needs to contain at least O and C. Then, when the first film formed in the film-forming step contains at least Si, O, and C, or at least Si, O, C, and N, it was confirmed that the above-mentioned effect could be more remarkably shown.

(b) Since the first film is modified into the second film using the O- and H-containing gas at the second temperature that is equal to or higher than the first temperature, impurities such as Cl contained in the first film can be removed during the modifying process, so that it is possible to reduce the concentration of impurities in the film and further increase the film density. This makes it possible to improve the wet etching resistance of the second film formed by modifying the first film.

(c) Since the first film is modified into the second film using the O- and H-containing gas in the modifying step, the components of the second film formed in the modifying step can be the same as the components of the first film before the modifying step. For example, when the first film is a SiOCN film, the second film after the modifying step can be a SiOCN film having the same components as the components of the first film. Further, for example, when the first film is a SiOC film, the second film after the modifying step can be a SiOC film having the same components as the components of the first film. This makes it possible to retain (preserve) elements, which are required for the second film to exhibit predetermined film characteristics, in the second film without desorbing the elements from the second film.

(d) Since the Si-containing gas, the C-containing gas, and the O-containing gas are used as the film-forming gases, and in the film-forming step, a cycle that includes non-simultaneously performing: a step of supplying the Si-containing gas to the wafer 200; a step of supplying the C-containing gas to the wafer 200; and a step of supplying the O-containing gas to the wafer 200, is performed a predetermined number of times, it is possible to form the first film having a concentration of C that is 20 at % or more, with good controllability.

(e) Since the Si-containing gas, the C- and N-containing gas, and the O-containing gas are used as the film-forming gases, and in the film-forming step, a cycle that includes non-simultaneously performing: a step of supplying the Si-containing gas to the wafer 200; a step of supplying the C- and N-containing gas to the wafer 200; and a step of supplying the O-containing gas to the wafer 200, is performed a predetermined number of times, it is possible to form the first film having a concentration of C that is 20 at % or more, with good controllability.

(f) Since the O-containing gas supplied in the film-forming step and the O- and H-containing gas supplied in the modifying step have different molecular structures from each other, the reaction required in each step is appropriately caused, which makes it possible to improve the controllability of processing in each step.

(g) Since a gas having an OH group such as a $H_2O$ gas or a $H_2O_2$ gas, that is, a gas having an OH bond, is used as the O- and H-containing gas in the modifying step, it is possible to efficiently desorb and remove impurities such as Cl contained in the first film from the first film.

(h) Since the first film having a concentration of C, which is 20 at % or more and 50 at % or less, is formed in the film-forming step, in addition to the above-mentioned effects, it is possible to reduce a leakage current of the second film obtained after the modifying process.

(i) Since a concentration of 0 in the second film after the modifying step is set to be higher than a concentration of 0 in the first film before the modifying step and a concentration of C in the second film after the modifying step is set to be lower than a concentration of C in the first film before the modifying step, it is possible to reduce a leakage current of the second film while maintaining the wet etching resistance of the second film.

(j) In the modifying step, the seam or the void in the first film can be eliminated by expanding the first film having the seam or the void at a high expansion coefficient, which makes it possible to obtain a void-free and seamless film.

(k) By setting the second temperature in the modifying step to a temperature higher than the first temperature in the film-forming step, the above-mentioned modifying effect can be further enhanced.

Other Embodiments

The one embodiment of the present disclosure has been specifically described above. However, the present disclosure is not limited to the above-described embodiment, and various changes can be made without departing from the gist of the present disclosure.

For example, as in the processing sequences shown below, the type of precursor gas or reaction gas may be changed to form a SiOC(N) film in the film-forming step. That is, a C-containing precursor gas can also be used as the precursor gas. Further, in addition to the C- and N-containing gas, a C-containing gas or a N- and H-containing gas can also be used as the reaction gas.

(Precursor gas→C-containing gas→O-containing gas)×n→O- and H-containing gas (C-containing precursor gas→N- and H-containing gas→O-containing gas)×n→O- and H-containing gas (C-containing precursor gas→O-containing gas)× n→O- and H-containing gas The same gas as the precursor gas in the above-described embodiment can be used as the precursor gas. As the C-containing precursor gas, it may be possible to use, for example, an alkylenehalosilane-based gas such as a bis (trichlorosilyl)methane $((SiCl_3)_2CH_2$, abbreviation: BTCSM) gas, a 1,2-bis(trichlorosilyl)ethane $((SiCl_3)_2C_2H_4$, abbreviation: BTCSE) gas or the like, or an alkylhalosilane-based gas such as a trimethylchlorosilane $(SiCl(CH_3)_3$, abbreviation: TMCS) gas, a dimethyldichlorosilane $(SiCl_2(CH_3)_2$, abbreviation: DMDCS) gas, a triethylchlorosilane $(SiCl(C_2H_5)_3$, abbreviation: TECS)) gas, a diethyldichlorosilane $(SiCl_2(C_2H_5)_2$, abbreviation: DEDCS) gas, a 1,1,2,2-tetrachloro-1,2-dimethyldisilane $((CH_3)_2Si_2Cl_4$, abbreviation: TCDMDS) gas, a 1,2-dichloro-1,1,2,2-tetramethyldisilane $((CH_3)_4Si_2Cl_2$, abbreviation: DCTMDS) gas or the like.

The same gases as the O-containing gas and the O- and H-containing gas in the above-described embodiment can be used as the O-containing gas and the O- and H-containing gas.

As the C-containing gas, in addition to the amine-based gas and the organic hydrazine-based gas in the above-described embodiment, it may be possible to use, for example, a hydrocarbon-based gas such as a propylene $(C_3H_6)$ gas, an ethylene $(C_2H_4)$ gas, or an acetylene $(C_2H_2)$ gas. The hydrocarbon-based gas can also be referred to as a C- and H-containing gas.

As the N- and H-containing gas, in addition to the amine-based gas and the organic hydrazine-based gas in the above-described embodiment, it may be possible to use, for example, a hydrogen nitride-based gas such as an ammonia $(NH_3)$ gas, a diazene $(N_2H_2)$ gas, a hydrazine $(N_2H_4)$ gas, or a $N_3H_8$ gas.

The processing procedure and process condition when performing these processing sequences can be, for example, the same as the processing procedure and process condition in the above-described embodiment. Also in this case, a SiOC(N) film having a concentration of C that is in a range of 20 to 50 at % can be formed as the first film, and the same effects as the processing sequence shown in FIG. 4 can be obtained.

Further, for example, after the second film is formed by performing the processing sequence shown in FIG. 4 or the above-mentioned processing sequences, an annealing step of annealing the second film at a third temperature equal to or higher than the second temperature may be further performed. In this case, the third temperature may be higher than the second temperature. The annealing step may be performed immediately after the second film is formed, or may be performed after forming the second film by sandwiching a substrate processing step such as another film-forming step between the second film-forming step and the annealing step.

An example of a process condition in the annealing step is described as follows.

Processing temperature: 700 to 1,000 degrees C., specifically 700 to 900 degrees C.

Processing pressure: 67 to 101,325 Pa

Inert gas supply flow rate: 1,000 to 5,000 sccm

Supply time: 10 to 120 minutes

A film such as a SiOC(N) film may shrink due to annealing, but film shrinkage of the second film formed by performing the processing sequence shown in FIG. 4 or the above-mentioned processing sequences can be suppressed even when the annealing is performed at the second temperature or higher, for example, at a temperature higher than the second temperature. As a result, the seam or the void that has been eliminated in the modifying step can be prevented from being regenerated due to the film shrinkage, which makes it possible to maintain a void-free and seamless filling state even after the annealing.

After the second film is formed by performing the processing sequence shown in FIG. 4 or the above-mentioned processing sequences, the annealing step may be continuously performed in a state where the wafer 200 is accommodated in the process chamber 201 without taking the wafer 200 out of the process chamber 201 from the inside of the process chamber 201. That is, the film-forming step, the modifying step, and the annealing step may be continuously performed in this order in the same process chamber (in-situ).

Further, after the second film is formed by performing the processing sequence shown in FIG. 4 or the above-mentioned processing sequences, the wafer 200 is taken out of the process chamber 201 and the annealing step may be performed in a process chamber different from the process chamber 201. That is, the film-forming step and modifying step and the annealing step may be performed in separate process chambers (ex-situ).

Further, the film-forming step, the modifying step, and the annealing step may be performed in separate process chambers (ex-situ).

Even in these cases, the same effects as in the above-described embodiment can be obtained. In the various cases described above, if these steps are performed in-situ, the wafer 200 is not exposed to the atmosphere on the way and these processes can be performed consistently while keeping the wafer 200 under vacuum, which makes it possible to perform stable substrate processing. Further, if these steps are performed ex-situ, the internal temperature of each process chamber can be set in advance to, for example, the processing temperature at each step or a temperature close to it, so that the time required for temperature adjustment can be shortened, resulting in the increase of production efficiency.

Further, the present disclosure is not limited to the above-described embodiment. For example, a stand-alone type apparatus, a cluster type apparatus in which a plurality of process chambers is provided around a transfer chamber, and the like may be used to perform the processing sequence shown in FIG. 4, the above-mentioned processing sequences, and the annealing step.

Recipes used in the substrate processing may be prepared individually according to the processing contents and may be stored in the memory device 121c via a telecommunication line or the external memory device 123. Moreover, at the beginning of the substrate processing, the CPU 121a may properly select an appropriate recipe from the recipes stored in the memory device 121c according to the contents of the substrate processing. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The example in which a film is formed using a batch-type substrate processing apparatus capable of processing a plurality of substrates at a time has been described in the above embodiment. The present disclosure is not limited to the above embodiment, but may be suitably applied, for example, to a case where a film is formed using a single-wafer type substrate processing apparatus capable of processing a single substrate or several substrates at a time. In addition, the example in which a film is formed using a substrate processing apparatus provided with a hot-wall-type process furnace has been described in the above embodiment. The present disclosure is not limited to the above embodiment, but may be suitably applied to a case where a film is formed using a substrate processing apparatus provided with a cold-wall-type process furnace.

Even when these substrate processing apparatus are used, a film can be formed according to the same processing procedures and process conditions as those of the above-described embodiment and modifications, and the same effects as in the above-described embodiment and modifications can be obtained.

Further, the above-described embodiment and modifications may be used in proper combination. The processing procedures and process conditions used in this case may be the same as, for example, the processing procedures and process conditions of the above-described embodiment.

Hereinafter, Examples will be described.

Example 1

Samples 1 to 6 in which SiOC(N) films having concentrations of C, which are different from one another, were formed on a wafer in which a concave portion is formed on the surface of the wafer were prepared. The SiOC(N) films in Samples 1 and 2 were formed according to a processing procedure and process conditions different from those in the film-forming step in the above-described embodiment. The SiOC(N) films in Samples 3 to 6 were formed according to the same processing procedure and process conditions as those in the film-forming step in the above-described embodiment. Then, each of Samples 1 to 6 was modified according to the same processing procedure and process conditions as those in the modifying step in the above-described embodiment. In the modifying process, a $H_2O$ gas was used as the O- and H-containing gas. Then, the expansion coefficient of the SiOC(N) film before and after the modifying process in each sample was measured. In addition, a sectional TEM image of each of the SiOC(N) films after the modifying process of Samples 1 to 6 was observed.

Figure 6:
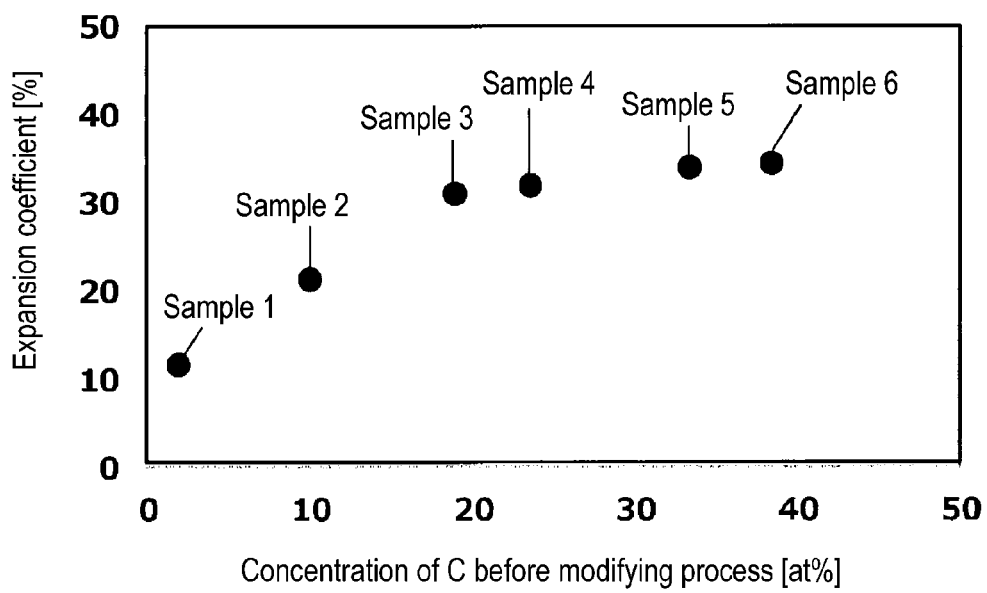
FIG. 6 is a diagram showing the relationship between a concentration of carbon (C) in a film before a modifying process and the expansion coefficient of the film before and after the modifying process is performed, in Samples 1 to 6.

FIG. 6 shows the measurement results of the expansion coefficient of each of the SiOC(N) film before and after the modifying process. In FIG. 6, the horizontal axis represents the concentration (at %) of C in the SiOC(N) film before the modifying process, and the vertical axis represents the expansion coefficient (%) of the SiOC(N) film before and after the modifying process.

As shown in FIG. 6, in Samples 1 and 2 in which the concentration of C in the SiOC(N) film before the modifying process was less than 20 at %, the expansion coefficient of the SiOC(N) film before and after the modifying process was less than 30%. On the other hand, in Samples 3 to 6 in which the concentration of C in the SiOC(N) film before the modifying process was equal to or more than 20 at %, the expansion coefficient of the SiOC(N) film before and after the modifying process was equal to or more than 30%.

Further, when the sectional TEM image of each of Samples was observed, in Samples 1 and 2 in which the concentration of C in the SiOC(N) film before the modifying process was less than 20 at %, it was confirmed that a seam occurred in the SiOC(N) film after the modifying process. On the other hand, in Samples 3 to 6 in which the concentration of C in the SiOC(N) film before the modifying process was equal to or more than 20 at %, it was confirmed that no seam or a void were generated in the SiOC(N) film after the modifying process. That is, even if a seam or a void are generated in the SiOC(N) film, by setting the concentration of C in the SiOC(N) film before the modifying process to 20 at % or more and performing the modifying process using the O- and H-containing gas, it was confirmed that the seam or the void in the SiOC(N) film could be eliminated, making it possible to improve the filling characteristics.

Example 2

Using the substrate processing apparatus shown in FIG. 1, a SiOC(N) film having a concentration of C that is 20 at % or more was formed on the surface of a wafer according to the substrate processing sequence shown in FIG. 4, and a modifying step using a $H_2O$ gas as the O- and H-containing gas was performed. Then, an annealing process was performed at a temperature of 800 to 900 degrees C. on the SiOC(N) film expanded by about 30% by being modified in the modifying step, and the film thickness of the SiOC(N) film before and after the annealing process was measured. The annealing process was performed under a $N_2$ gas atmosphere. That is, the annealing process was performed while supplying a $N_2$ gas to the wafer 200 ($N_2$ annealing). The process conditions other than the above in each step were set to predetermined conditions within the process condition range in the above-described embodiment.

Figure 7:
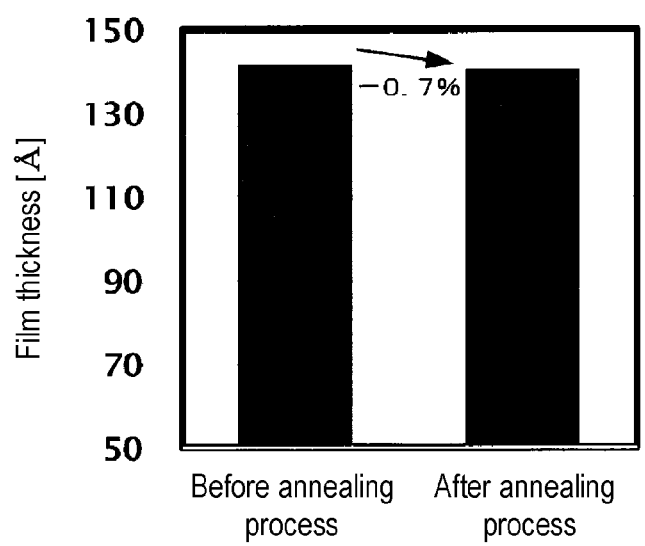
FIG. 7 is a diagram showing a change in film thickness before and after an annealing process when a SiOC(N) film having the concentration of C that is 20 at % or more is subjected to a modifying process using $H_2O$ and then an annealing process.

FIG. 7 shows the measurement results of the film thickness of the SiOC(N) film before and after the annealing process. In FIG. 7, the horizontal axis represents before and after the annealing process, and the vertical axis represents the film thickness (Å).

As shown in FIG. 7, the film thickness of the SiOC(N) film after the annealing process is reduced by about 0.7% with respect to the film thickness of the SiOC(N) film before the annealing process, and the film shrinkage rate is less than 1%. That is, it was confirmed that the film shrinkage rate was less than 1% even when the annealing process was performed on the SiOC(N) film expanded by about 30% by the modifying process.

Here, if the shrinkage rate of the SiOC(N) film before and after the annealing process is large, the seam or the void that has been eliminated by the modifying process may be restored by the annealing process. According to this embodiment, since the shrinkage rate of the SiOC(N) film by the annealing process can be set to be less than 1%, even when the annealing process is performed after the film-forming step and the modifying step in the present embodiment are performed, it was confirmed that the SiOC(N) film, that is, the second film, was prevented from shrinking, and a void-free and seamless state could be maintained without restoring the seam or the void.

That is, according to the present embodiment, it can be confirmed that it is possible to fill an inside of a concave portion with a SiOC(N) film in a void-free and seamless manner, and thereafter, even when a process such as annealing is performed under a relatively high temperature, it is possible to maintain a void-free and seamless state.

According to the present disclosure in some embodiments, it is possible to form a void-free and seamless film on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a first film containing at least oxygen and carbon and having a concentration of carbon, which is 20 at % or more, on a substrate by supplying a film-forming gas to the substrate at a first temperature; and
   (b) modifying the first film into a second film by supplying an oxygen- and hydrogen-containing gas to the substrate on which the first film is formed, at a second temperature that is equal to or higher than the first temperature,
   wherein the first film formed in (a) includes a seam or a void, and
   wherein in (b), the seam or the void in the first film is eliminated by expanding the first film.

2. The method of claim 1, wherein a concave portion is formed in a surface of the substrate, and
   wherein in (a), the first film is formed so as to fill an inside of the concave portion.

3. The method of claim 1, wherein the first film contains at least silicon, oxygen, and carbon.

4. The method of claim 3, wherein the second film contains at least silicon, oxygen, and carbon.

5. The method of claim 1, wherein the first film contains at least silicon, oxygen, carbon, and nitrogen.

6. The method of claim 5, wherein the second film contains at least silicon, oxygen, carbon, and nitrogen.

7. The method of claim 1, wherein the film-forming gas includes a silicon-containing gas, a carbon-containing gas, and an oxygen-containing gas, or includes a silicon- and carbon-containing gas and an oxygen-containing gas.

8. The method of claim 7, wherein in (a), a cycle is performed a predetermined number of times, the cycle including non-simultaneously performing:
   supplying the silicon-containing gas to the substrate;
   supplying the carbon-containing gas to the substrate; and
   supplying the oxygen-containing gas to the substrate, or
   a cycle is performed a predetermined number of times, the cycle including non-simultaneously performing:
   supplying the silicon- and carbon-containing gas to the substrate; and
   supplying the oxygen-containing gas to the substrate.

9. The method of claim 7, wherein the oxygen-containing gas supplied in (a) has a molecular structure different from a molecular structure of the oxygen- and hydrogen-containing gas supplied in (b).

10. The method of claim 1, wherein the film-forming gas includes a silicon-containing gas, a carbon- and nitrogen-containing gas, and an oxygen-containing gas, or includes a silicon- and carbon-containing gas, a nitrogen-containing gas, and an oxygen-containing gas.

11. The method of claim 10, wherein in (a), a cycle is performed a predetermined number of times, the cycle including non-simultaneously performing:
   supplying the silicon-containing gas to the substrate;
   supplying the carbon- and nitrogen-containing gas to the substrate; and
   supplying the oxygen-containing gas to the substrate, or a cycle is performed a predetermined number of times, the cycle including non-simultaneously performing:

supplying the silicon- and carbon-containing gas to the substrate;

supplying the nitrogen-containing gas to the substrate; and supplying the oxygen-containing gas to the substrate.

12. The method of claim 1, wherein the oxygen- and hydrogen-containing gas includes at least one selected from a group consisting of a $H_2O$ gas and a $H_2O_2$ gas.

13. The method of claim 1, wherein the concentration of carbon in the first film is equal to or more than 20 at % and equal to or less than 50 at %.

14. The method of claim 1, wherein a concentration of oxygen in the second film is higher than a concentration of oxygen in the first film, and
wherein a concentration of carbon in the second film is lower than the concentration of carbon in the first film.

15. The method of claim 1, wherein the second temperature is a temperature that is higher than the first temperature.

16. The method of claim 1, further comprising (c) annealing the second film at a third temperature that is equal to or higher than the second temperature.

17. The method of claim 16, wherein the third temperature is a temperature that is higher than the second temperature.

18. A method of manufacturing a semiconductor device comprising:
processing a substrate according to the method of claim 1.

19. A substrate processing apparatus comprising:
a process chamber in which a substrate is processed;
a film-forming gas supply system configured to supply a film-forming gas to the substrate in the process chamber;
an oxygen- and hydrogen-containing gas supply system configured to supply an oxygen- and hydrogen-containing gas to the substrate in the process chamber; and
a controller configured to be capable of controlling the film-forming gas supply system and the oxygen- and hydrogen-containing gas supply system so as to perform:
(a) forming a first film containing at least oxygen and carbon and having a concentration of carbon, which is 20 at % or more, on the substrate by supplying the film-forming gas to the substrate at a first temperature; and
(b) modifying the first film into a second film by supplying the oxygen- and hydrogen-containing gas to the substrate on which the first film is formed, at a second temperature that is equal to or higher than the first temperature,
wherein the first film formed in (a) includes a seam or a void, and
wherein in (b), the seam or the void in the first film is eliminated by expanding the first film.

20. A non-transitory computer-readable recording medium storing a program that causes, by a computer, a substrate processing apparatus to perform a process, the process comprising:
(a) forming a first film containing at least oxygen and carbon and having a concentration of carbon, which is 20 at % or more, on a substrate by supplying a film-forming gas to the substrate at a first temperature; and
(b) modifying the first film into a second film by supplying an oxygen- and hydrogen-containing gas to the substrate on which the first film is formed, at a second temperature that is equal to or higher than the first temperature,
wherein the first film formed in (a) includes a seam or a void, and
wherein in (b), the seam or the void in the first film is eliminated by expanding the first film.

* * * * *